United States Patent
Symons

(10) Patent No.: US 11,611,358 B2
(45) Date of Patent: Mar. 21, 2023

(54) SYSTEMS AND METHODS FOR DETECTING OR PREVENTING FALSE DETECTION OF THREE ERROR BITS BY SEC

(71) Applicant: Kioxia Corporation, Tokyo (JP)

(72) Inventor: David M. Symons, Kidlington (GB)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/816,093

(22) Filed: Mar. 11, 2020

(65) Prior Publication Data
US 2021/0194506 A1    Jun. 24, 2021

Related U.S. Application Data

(60) Provisional application No. 62/953,443, filed on Dec. 24, 2019.

(51) Int. Cl.
| H03M 13/19 | (2006.01) |
| H03M 13/15 | (2006.01) |
| H03M 13/23 | (2006.01) |
| H03M 13/17 | (2006.01) |

(52) U.S. Cl.
CPC .......... *H03M 13/19* (2013.01); *H03M 13/152* (2013.01); *H03M 13/17* (2013.01); *H03M 13/235* (2013.01)

(58) Field of Classification Search
CPC .................................................... H03M 13/19
See application file for complete search history.

(56) References Cited

U.S. PATENT DOCUMENTS

| 3,697,949 A * | 10/1972 | Carter | G06F 11/1012 |
| | | | 714/763 |
| 2005/0188292 A1* | 8/2005 | Chen | G11C 29/42 |
| | | | 714/768 |
| 2008/0168319 A1 | 7/2008 | Lee et al. | |
| 2012/0331282 A1 | 12/2012 | Yurzola et al. | |
| 2014/0293704 A1 | 10/2014 | Ghalam et al. | |

(Continued)

FOREIGN PATENT DOCUMENTS

| CN | 102110481 A | 6/2011 |
| CN | 110033816 A | 7/2019 |
| JP | H520896 A | 1/1993 |

OTHER PUBLICATIONS

Foreign Search Report on PCT PCT/IB2020/062254 dated Mar. 23, 2021.

(Continued)

*Primary Examiner* — Joseph D Torres
(74) *Attorney, Agent, or Firm* — Foley & Lardner LLP

(57) ABSTRACT

Various implementations described herein relate to correcting errors in Dynamic Random Access Memory (DRAM). A memory controller uses an Error Correcting Code (ECC) to store an encoded data word within a DRAM die. The DRAM die is communicatively coupled the memory controller by a memory data bus. The DRAM die includes on-die error correction for data bits stored in the DRAM. Upon reading the encoded data word, the memory controller corrects and detects one or more errors. The one or more errors are introduced by at least one of the on-die error correction of the DRAM die or the memory data bus.

18 Claims, 6 Drawing Sheets

(56) References Cited

U.S. PATENT DOCUMENTS

| | | | |
|---|---|---|---|
| 2015/0286529 A1 | 10/2015 | Lunde | |
| 2017/0004035 A1* | 1/2017 | Suh | G06F 11/1068 |
| 2017/0060680 A1* | 3/2017 | Halbert | G06F 11/1068 |
| 2017/0093438 A1* | 3/2017 | Motwani | G06F 11/1068 |
| 2019/0102254 A1* | 4/2019 | Saxena | H03M 13/19 |
| 2020/0192754 A1* | 6/2020 | Cho | H03M 13/3707 |
| 2020/0394102 A1* | 12/2020 | Cha | H03M 13/05 |
| 2020/0394104 A1* | 12/2020 | Brooks | G06F 11/1096 |

OTHER PUBLICATIONS

Office Action with Search Report issued in Chinese application No. 202080090269.7 dated Jan. 3, 2023.

* cited by examiner

SYSTEMS AND METHODS FOR DETECTING OR PREVENTING FALSE DETECTION OF THREE ERROR BITS BY SEC

RELATED APPLICATION

This application claims priority to U.S. Provisional Patent Application No. 62/953,443, filed on Dec. 24, 2019, the entire content of which is fully incorporated herein by reference.

TECHNICAL FIELD

The present disclosure generally relates to error correction, and specifically, to mechanisms for preventing false detection of three error bits by Single Error Correction (SEC).

BACKGROUND

Dynamic Random-Access Memory (DRAM) is a type of volatile memory that can be used by Systems on Chips (SoCs) to provide a large memory capacity for storing bits of data. The probability of a bit being in error as the bit is read back from the DRAM is non-zero and therefore cannot be ignored. Typically, the error rate for DRAM can be a single bit in error every 14 to 40 hours per Gigabit of DRAM. In that regard, the SoC implements error correction logic that either (1) corrects the errors, or (2) detects the errors and prevents incorrect data (bits) being used. In a Solid State Drive (SSD) having a SoC controller that uses DRAM for storage, suitable error correction mechanisms can be provided to reduce incorrect data from being saved to non-volatile memory in the SSD or returned to a host.

SUMMARY

Some arrangements of a system for correcting errors in DRAM includes a memory controller and a DRAM die. The DRAM die is communicatively coupled to the memory controller by a memory data bus. The DRAM die includes on-die error correction for data bits stored in the DRAM. The memory controller is configured to store, using an Error Correcting Code (ECC), an encoded data word within the DRAM die. Upon reading the encoded data word, the memory controller corrects and detects one or more errors. The one or more errors are introduced by at least one of the on-die error correction of the DRAM die or the memory data bus.

In some arrangements, a method for correcting errors in DRAM includes a memory controller using an Error Correcting Code (ECC) to store an encoded data word within a DRAM die. The DRAM die is communicatively coupled to the memory controller by a memory data bus. The DRAM die includes on-die error correction for data bits stored in the DRAM. Upon reading the encoded data word, the memory controller corrects and detects one or more errors. The one or more errors are introduced by at least one of the on-die error correction of the DRAM die or the memory data bus.

In some arrangements, a non-transitory computer-readable medium storing computer-readable instructions, such that when executed, causes a memory controller of to store, using an Error Correcting Code (ECC), an encoded data word within a Dynamic Random Access Memory (DRAM) die, the DRAM die communicatively coupled the memory controller by a memory data bus, the DRAM die including on-die error correction for data bits stored in the DRAM. Upon reading the encoded data word, the memory controller is further caused to correct and detect one or more errors. The one or more errors are introduced by at least one of the on-die error correction of the DRAM die or the memory data bus.

DETAILED DESCRIPTION

Figure 1:
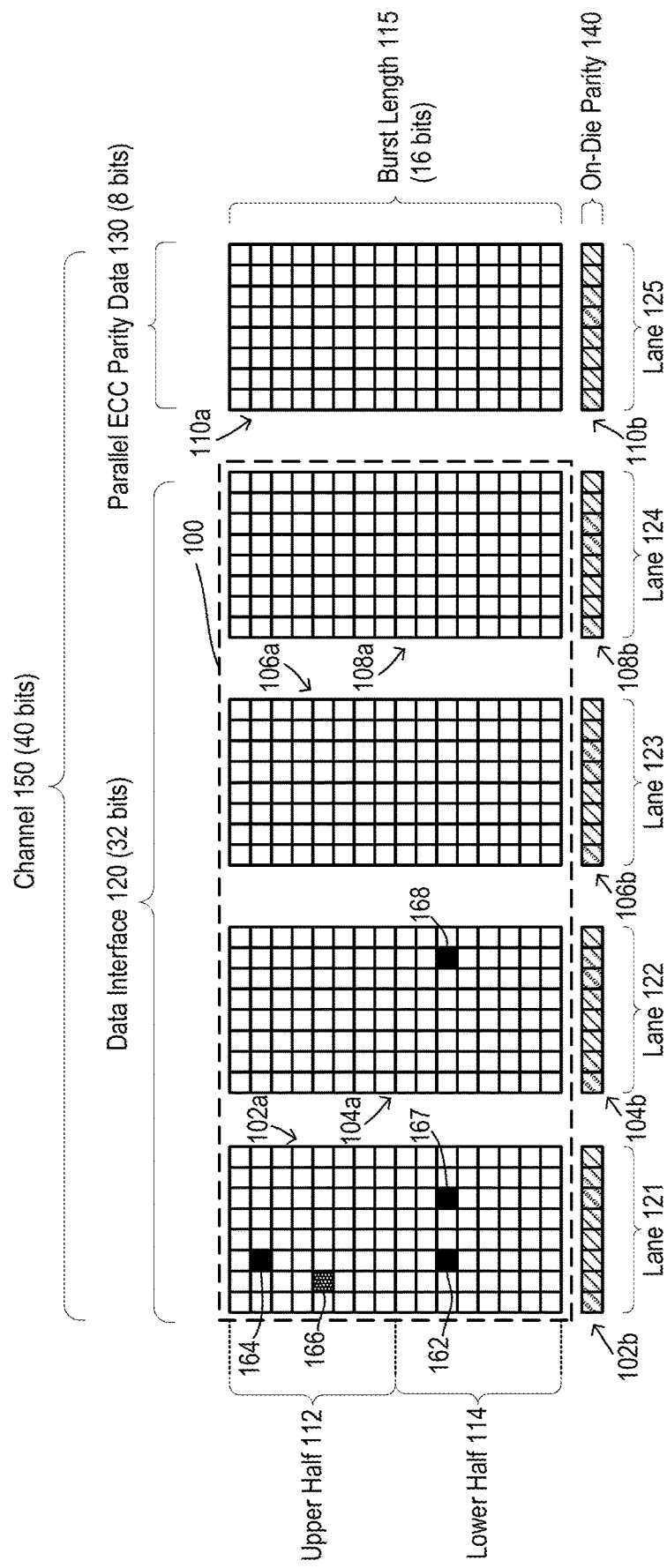
FIG. 1 is a schematic diagram illustrating an example of a burst of data for an implementation of a DRAM, according to some arrangements.

Generations of DRAM designs such as those up to Double Data Rate 4 (DDR4) used by SoCs or DRAM memory controllers often implement a SECDED Error Correction Code (ECC) scheme. The codeword of such correction scheme can be set to a same size as that of a DRAM burst (e.g., 32 bytes), and is capable of correcting a single error (e.g., a single bit in error) in the DRAM burst. As compared to the likelihood of one error occurring in a single DRAM burst, the likelihood of two errors (e.g., two bits in error) in a single DRAM burst is extremely unlikely, e.g., less than 10 Failures In Time (FIT) per billion device hours. A SECDED codeword can guarantee detecting two errors in a single DRAM burst. Generally, the probability of three errors (e.g., three bits in error) occurring in a single DRAM burst is extremely small and can thus be disregarded. A SECDED codeword has a probability of approximately 0.5 for failing to detect a codeword with three errors in a DRAM burst.

Some DRAM designs such as Double Data Rate 5 (DDR5) implement an on-die SEC ECC scheme for error detection or correction, where the on-die SEC scheme uses an SEC codeword to cover a unit of 128 bits of data. Such a correction scheme can correct a single error (e.g., 1 error bit) in 128 bits of data. However, approximately 50% of the time, the on-die SEC error correction scheme incorrectly interprets two errors (e.g., 2 error bits) in 128 bits of data as a single error (in a different location to the 2 original errors) and falsely corrects a correct bit of the 128 bits of data into a wrong bit, while leaving the original 2 errors intact, resulting in an SEC codeword with three errors (e.g., 3 total error bits, composed of 2 original error bits and one miscorrected bit). In that regard, in the scenario in which the probability of two errors in a DRAM burst is sufficiently high (e.g., the probability of two errors in a DRAM burst cannot be disregarded as negligible), an ECC scheme implemented on the SoC should preferably be configured to detect both two errors and three errors in a DRAM burst due to the behaviors of on-die SEC scheme in DDR5 designs. That is, given that the on-die SEC scheme in DDR5 may fail in detecting two errors in a DRAM burst and may induce a third error in a DRAM burst, an additional ECC scheme can be implemented on the SoC to detect two and three errors in a DRAM burst.

In some examples, a SECDED ECC scheme may not guarantee accurate detection of three errors in a DRAM burst because the minimum distance between codewords of the SECDED ECC scheme is four, therefore 3 bits in error in one codeword may be indistinguishable from 1 bit in error in another codeword. On the other hand, Bose-Chaudhuri-Hocquenghem (BCH) codeword with a parameter t of 2 has a minimum distance between codewords of 5, therefore ensuring reliable detection of 3 bits in error. A BCH decoder can be used in a mode in which the BCH decoder, in a DRAM burst, corrects a single error and detects, but does not attempt to correct, two errors (since 2 errors in one codeword may be indistinguishable from 3 errors in another codeword) and also reliably detects 3 errors. In that mode, the BCH decoder guarantees accurate detection of errors in any scenario in which two or three errors occur in a DRAM burst. Such BCH decoding scheme is compatible with the implementation of the on-die SEC for DDR5 DRAMs.

According to the DDR5 draft specification, the SEC scheme implemented on a DDR5 DRAM employs 128 bits of data in generating a parity byte (e.g., an ECC code of 8 ECC check bits). The parity byte is also written to the DRAM, along with the data. The scheme can detect and correct a single error. In response to determining that a bit is in error, the SEC scheme provides an 8-bit value that identifies location of the single error bit. However, said SEC scheme will fail to detect about half the possible scenarios where 2 bits are in error, and furthermore in those scenarios, said SEC scheme will identify and mis-correct a third bit which was not in error and unrelated to the original 2 bits in error. This means that 50% of the time when two errors occur, the SEC scheme results in three errors in the codeword (two original bits in error plus one mis-corrected bit).

The SEC scheme splits the data bits of an SEC codeword into four quarters, Q1, Q2, Q3 and Q4, as shown in Tables 136 and 137 of a draft of the DDR5 specification which show an example parity check matrix. A top 64 bits (63:0) of the codeword includes Q1 and Q2. A bottom 64 bits (127:64) of the codeword includes Q3 and Q4. By design of the SEC scheme for DDR5, in the situation in which two error bits occur in a first half of the codeword (e.g., in the top 64 bits, Q1 and Q2), the SEC scheme may induce through mis-correction an additional error bit in a second half of the codeword (e.g., in the bottom 64 bits, in Q3 or Q4). Similarly, in the situation in which two error bits occur in the second half of the codeword (e.g., in the bottom 64 bits, Q3 and Q4), the SEC scheme may induce through mis-correction an additional error bit in the first half of the codeword (e.g., in the top 64 bits, in Q1 or Q2). A DDR5 Dual-Inline Memory Module (DIMM) has 5 byte lanes per channel (e.g., 40 bits per lane) with an additional byte used for parallel ECC which is generated and sent along with the 32 bits of data when the data is written to the DIMM.

FIG. 1 is a schematic diagram illustrating an example of a burst 100 of data for an implementation of a DRAM, according to some arrangements. Referring to FIG. 1, a DDR5 DRAM can transfer data using data bursts, each of which can be a data burst such as but not limited to, the burst 100. As shown, the burst 100 has a burst length 115, an example of which is 16 bits. In an example in which the DRAM has a data interface 120 that is 32-bit wide, a total size of the burst 100 is 64 bytes (512 bits). A DIMM of the DRAM has a channel 150 that has a width of 5 bytes (40 bits). The channel 150 includes lanes 121-125. Each of the lanes 121-125 has a width of a byte (8 bits). As shown, the burst 100 is transferred using the lanes 121-124. The lane 125 corresponds to parallel ECC parity 130 (including parallel ECC parity bits 110a and on-die parity 110b), which has a width of a byte (8 bits). The burst 100 corresponds to on-die SEC codewords, which includes data 102a, 104a, 106a, and 108a, together with respective on-die parity 102b, 104b, 106b and 108b. That is, a first on-die SEC codeword (denoted as 102a,b) includes the data 102a and one-die parity 102b. A second on-die SEC codeword (denoted as 104a,b) includes the data 104a and one-die parity 104b. A third on-die SEC codeword (denoted as 106a,b) includes the data 106a and one-die parity 106b. A fourth on-die SEC codeword (denoted as 108a,b) includes the data 104a and one-die parity 104b. Each of the on-die SEC codewords 102a,b, 104a,b, 106a,b, and 108a,b corresponds to a respective one of the lanes 121-124.

The on-die SEC of the DRAM generates on-die parity 140 (include the on-die parity 102b, 104b, 106b and 108b) for the burst 100 (e.g., for the data 102a, 104a, 106a, and 108a, the on-die SEC generates corresponding ones of the on-die parity 102b, 104b, 106, and 108b) and for the parallel ECC parity 130 (e.g., for the parity bits 110a, the on-die SEC generates the on-die parity 110b). As shown, the on-die parity 140 includes an on-die parity bit generated for every 16 bits along the burst length 115. The on-die SEC of the DRAM generates a byte of the on-die parity 140 (e.g., the on-die parity 102b, 104b, 106b and 108b) for each of the parts of the data burst (e.g., the data 102a, 104a, 106a, and 108a. The on-die SEC of the DRAM generates a byte of the on-die parity 110b for the parallel ECC parity bits 110a corresponding to the burst 100.

As disclosed in further details herein, various ECC schemes or mechanisms can be implemented for preventing false detection of two error bits by the SEC which result in 3 error bits. Some examples of the ECC schemes ensures that an SECDED codeword (e.g., a (32, 40) SECDED codeword) for parallel ECC does not detect more than 2 error bits in the burst 100.

FIG. 1 illustrates three error scenarios in which are two error bits actually occur in the burst 100. These scenarios may have probabilities of occurrence that are on a same order of magnitude.

In a first scenario (referred to as "Scenario A"), a bit 162 and a bit 164 are error bits actually occurring in the burst 100 (e.g., in the data 102a of on-die SEC codeword 102a,b). The error bit 162 is in a lower half 114 of the data 102a of the on-die SEC codeword 102a,b. The error bit 164 is in an upper half 112 of the data 102a of the on-die SEC codeword 102a,b. In Scenario A, a third error bit is not induced by the on-die SEC based on the error bits 162 and 164.

In a second scenario (referred to as "Scenario B"), the bit 162 and a bit 167 are error bits actually occurring in the burst 100 (e.g., in the data 102a of the on-die SEC codeword 102a,b). As shown, both the error bits 162 and 167 are in the lower half 114 of the data 102a of the on-die SEC codeword 102a,b. The combination of the error bits 162 and 167 induces the on-die SEC codeword to falsely detect a third bit 166 as an error bit, where the bit 166 is in fact a correct bit falsely identified as an error bit. The bit 166 is in the upper half 112 of the data 102a of the on-die SEC codeword 102a,b.

In a third scenario (referred to as "Scenario C"), the bit 162 and a bit 168 are error bits actually occurring in the burst 100. As shown, the error bit 162 occurs in the lower half 114 of the data 102a of the on-die SEC codeword 102a,b. The error bit 168 occurs in the lower half 114 of the data 104a of the on-die SEC codeword 104a,b, which is a codeword different from the on-die SEC codeword 102a,b. In Scenario C, a third error bit is not induced by the on-die SEC based on the error bits 162 and 168.

As shown, the parallel ECC scheme described herein can generate the parallel ECC parity 130 across the entire channel 150 (e.g., the entire data interface 120) for each beat of the burst 100 to detect each of Scenario A, Scenario B, and Scenario C.

Figure 2:
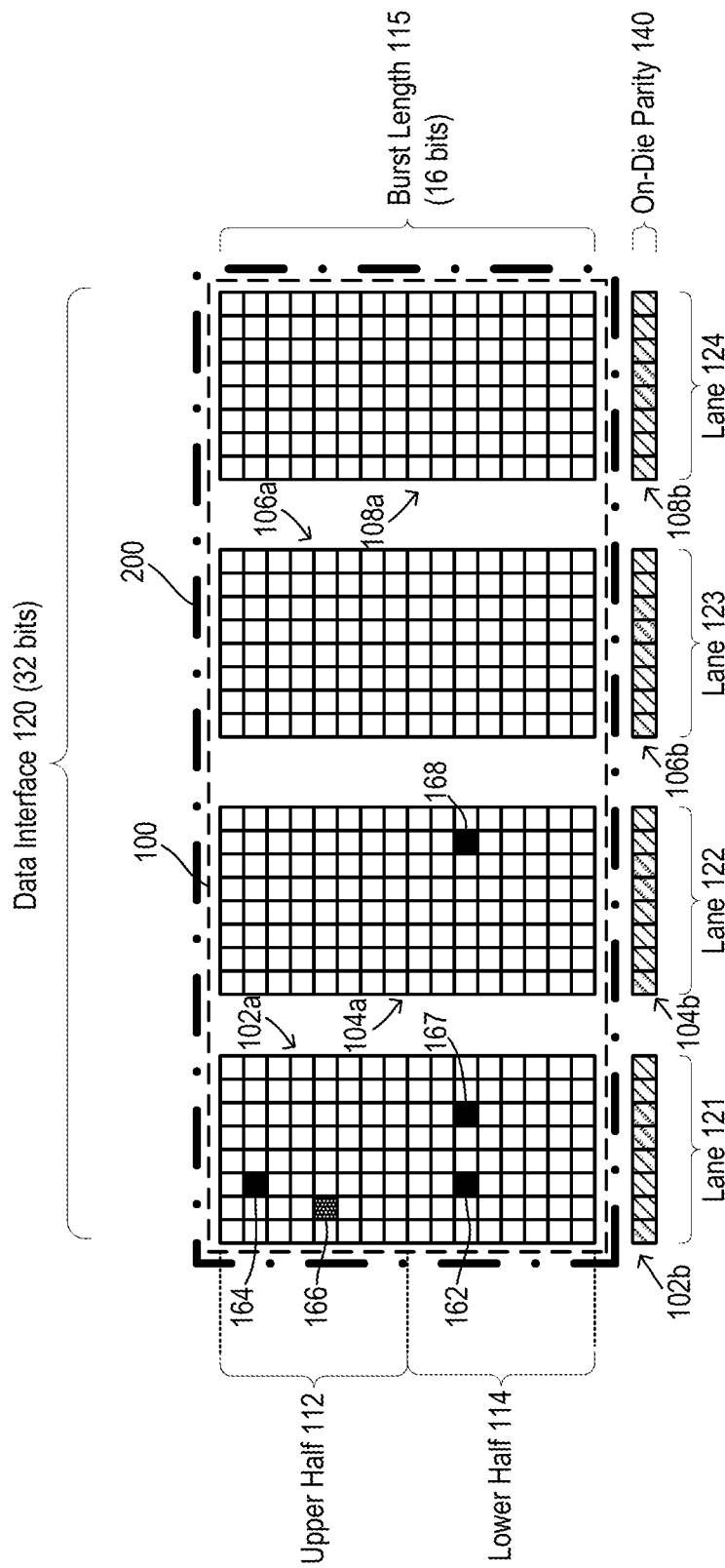
FIG. 2 illustrates an example of a Single Error Correction, Double Error Detection (SECDED) codeword for a burst of data for an implementation of a DRAM, according to some arrangements.

FIG. 2 illustrates an example of a SECDED codeword 200 for the burst 100 of data (FIG. 1) for an implementation of the DRAM, according to some arrangements. Referring to FIGS. 1 and 2, the SECDED codeword 200 corresponds to a (512, 502) SECDED scheme. In the (512, 502) SECDED scheme, 502 bits of user data are encoded into a 512 bit codeword and saved in the DRAM in burst 100 including the data 102a, 104a, 106a and 108a on the lanes 121, 122, 123 and 124, respectively. As shown, the SECDED codeword 200 may be applied to the entire burst 100 to detect error bits therein, according to the (512, 502) SECDED scheme. That is, the SECDED codeword 200 may be used to detect error bits in all of the data 102a, 104a, 106a, and 108a stored on-die. As described, the ECC scheme applied to the burst 100 is capable of detecting two error bits in the burst 100. In that regard, the SECDED codeword 200 can be applied to the burst 100 to detect the error bits 162 and 164 in Scenario A, and the error bits 162 and 168 in Scenario C.

With regard to Scenario B, two error bits 162 and 167 in the data 102a stored on-die may be falsely corrected by on-die SEC to generate the "error" bit 166, thus generating three total error bits. The SECDED codeword 200 therefore covers three error bits 162, 166, and 167 in Scenario B, meaning that the (512, 502) SECDED scheme using the SECDED codeword 200 may not detect the three error bits 162, 166, and 167. Accordingly, the SECDED codeword 200 of the (512, 502) SECDED scheme may not be capable of addressing Scenario B. In some cases, the (512, 502) SECDED scheme may not be implemented with DDR5 DRAMs.

Figure 3:
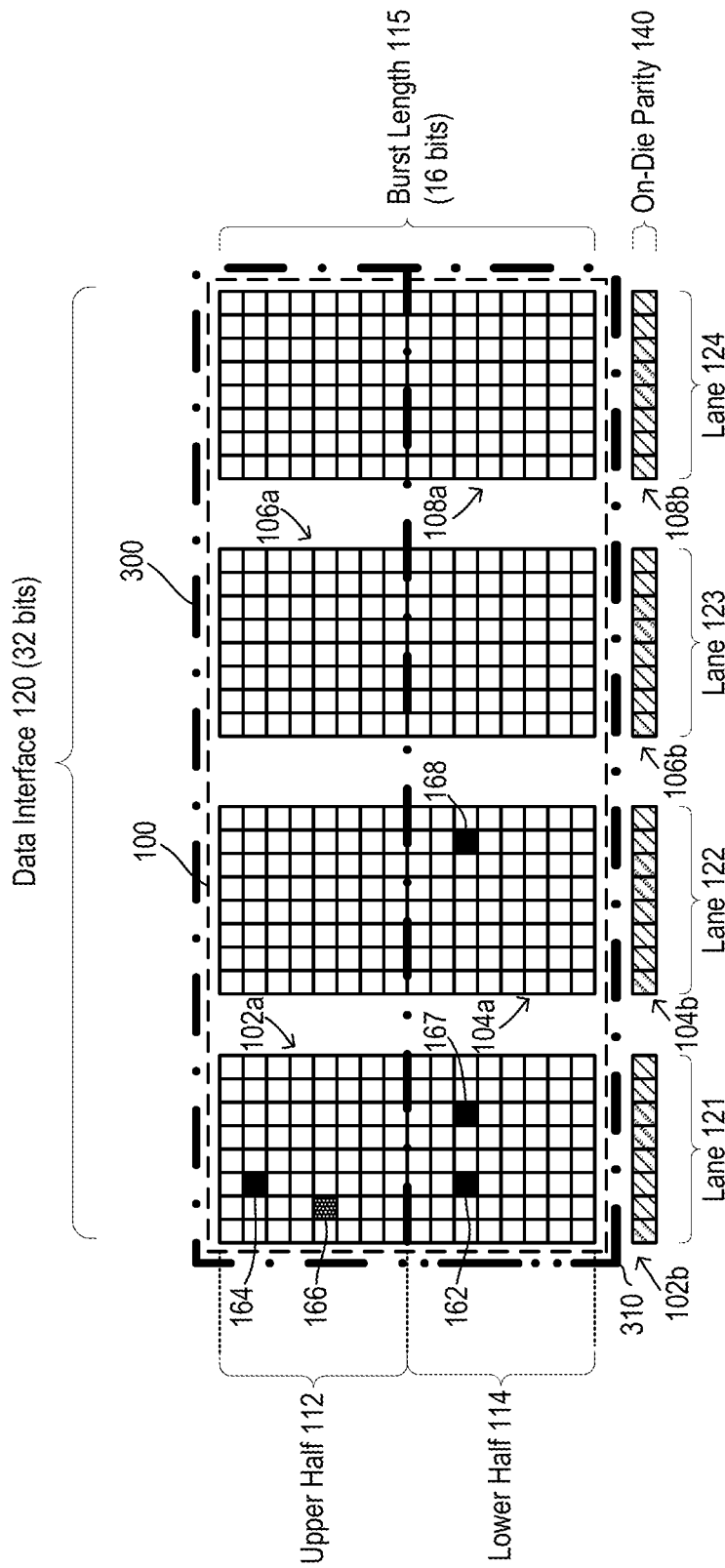
FIG. 3 illustrates an example of two SECDED codewords for a burst of data for an implementation of a DRAM, according to some arrangements.

FIG. 3 illustrates an example of two SECDED codewords 300 and 310 for the burst 100 of data (FIG. 1) for an implementation of the DRAM, according to some arrangements. Referring to FIGS. 1 and 3, the SECDED codewords 300 and 310 corresponds to a (256, 247) SECDED scheme. In the (256, 247) SECDED scheme, 247 bits of user data are encoded into a 256 bit codeword and saved in the DRAM in burst 100 including the data 102a, 104a, 106a and 108a on the lanes 121, 122, 123 and 124, respectively. As shown, the SECDED codeword 300 can be applied to the upper half 112 of the burst 100 (e.g., the upper halves 112 of the data 102a, 104a, 106a, and 108a) to detect error bits therein. That is, the SECDED codeword 300 can be used to detect error bits in the upper halves 112 of the data 102a, 104a, 106a, and 108a. The SECDED codeword 310 can be applied to the lower half 114 of the burst 100 (e.g., the lower halves 114 of the data 102a, 104a, 106a, and 108a) to detect error bits therein. That is, the SECDED codeword 310 can be used to detect error bits in the lower halves 114 of the data 102a, 104a, 106a, and 108a. The burst 100 includes the SECDED codewords 300 and 310.

As described, the ECC scheme applied to the burst 100 is capable of detecting two error bits in the burst 100. A (256, 247) SECDED scheme using the SECDED codewords 300 and 310 can be implemented on a 32-bit data interface (such as the data interface 120) due to the fact that an on-die SEC codeword (e.g., each of the on-die SEC codewords 102a,b, 104a,b, 106a,b, and 108a,b) is split into quarters (Q1-Q4) and the SEC scheme will only have two errors in the upper half or lower half quarters. In that regard, neither of the SECDED codewords 300 and 310 needs to detect more than two error bits for the burst 100. The SECDED codewords 300 and 310 can then always detect a double error.

For example, in Scenario A, the SECDED codeword 300 can be applied to the upper half 112 of the burst 100 to detect the error bit 164, and the SECDED codeword 310 can be applied to the lower half 114 of the burst 100 to detect the error bit 162. In Scenario B, the SECDED codeword 300 can be applied to the upper half 112 of the burst 100 to detect the error bit 166, and the SECDED codeword 310 can be applied to the lower half 114 of the burst 100 to detect the error bits 162 and 167. In Scenario C, the SECDED codeword 300 can be applied to the upper half 112 of the burst 100 and detects no error bits, and the SECDED codeword 310 can be applied to the lower half 114 of the burst 100 to detect the error bits 162 and 168.

Figure 4:
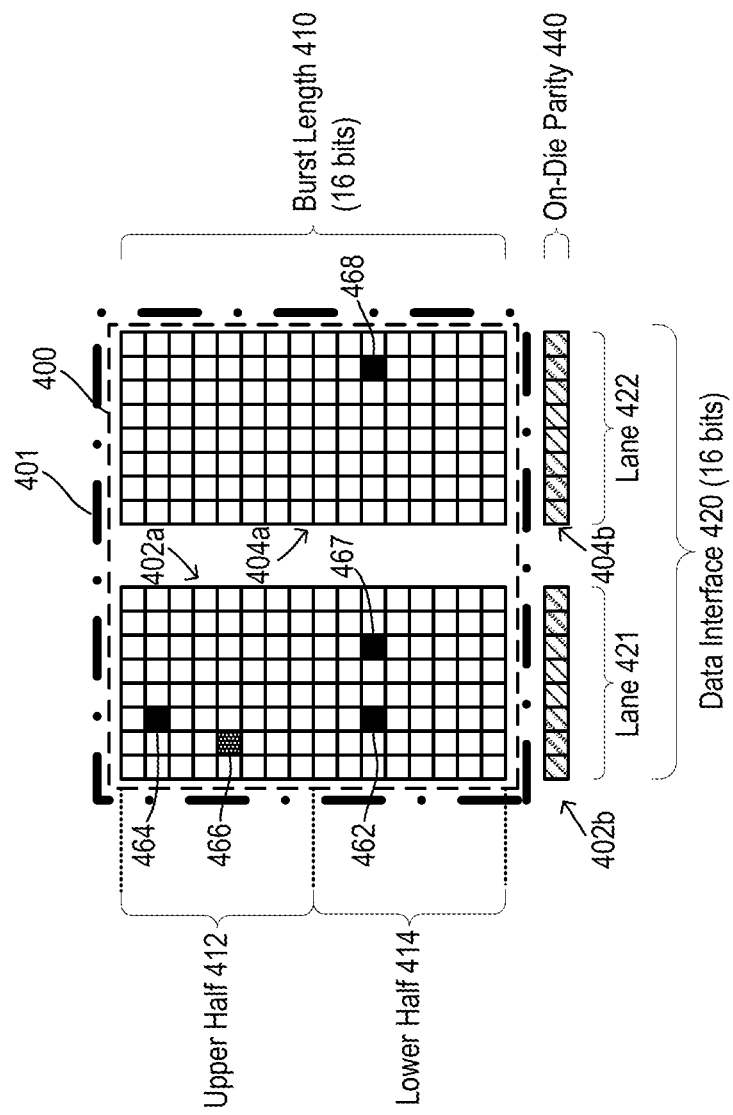
FIG. 4 illustrates an example of two SECDED codewords for a burst of data for an implementation of a DRAM, according to some arrangements.

FIG. 4 is a schematic diagram illustrating an example of a burst 400 of data for an implementation of a DRAM and an example of an SECDED codeword 401 for the burst 400 of data, according to some arrangements. Referring to FIG. 4, a DDR5 DRAM can transfer data using data bursts, each of which can be a data burst such as but not limited to, the burst 400. As shown, the burst 400 has a burst length 410, an example of which is 16 bits. In an example in which the DRAM has a data interface 420 that is 16-bit wide, a total size of the burst 400 is 32 bytes (256 bits). The data interface 420 includes at least lanes 421 and 422. Each of the lanes of the channel has a width of a byte (8 bits). As shown, the burst 400 is transferred using the lanes 421 and 422. In some examples, the channel includes an additional lane (not shown) that corresponds to parallel ECC parity, which has a width of a byte (8 bits). The burst 400 corresponds to data 402a and 404a on lanes 421 and 422 respectively. That is, a first on-die SEC codeword (denoted as 402a,b) includes the data 402a and one-die parity 402b. A second on-die SEC codeword (denoted as 404a,b) includes the data 404a and one-die parity 404b. Each of the on-die SEC codewords 402a,b and 404a,b corresponds to a respective one of the lanes 421 and 422.

The on-die SEC of the DRAM generates on-die parity 440 for the burst 400 (e.g., including the parity 402b and 404b generated for the data 402a and 404a) and for the parallel ECC parity. The on-die parity 440 includes an on-die parity bit generated for every 16 bits along the burst length 410. The on-die SEC of the DRAM generates a byte of on-die parity 440 (e.g. the parity 402b and parity 404b) for each of the data 402a and 404a. The on-die SEC of the DRAM may generate a byte of the on-die parity 440 for the parallel ECC parity in some examples.

FIG. 4 illustrates three error scenarios in which are two error bits actually occur in the burst 400. These scenarios may have probabilities of occurrence that are on a same order of magnitude.

In a first scenario (referred to as "Scenario A"), a bit 462 and a bit 464 are error bits actually occurring in the burst 400 (e.g., in the data 402a). The error bit 462 is in a lower half 414 of the data 402a. The error bit 464 is in an upper half 412 of the data 402a. In Scenario A, a third error bit is not induced by the on-die SEC based on the error bits 462 and 464.

In a second scenario (referred to as "Scenario B"), the bit 462 and a bit 467 are error bits actually occurring in the burst 400 (e.g., in the data 402a). As shown, both the error bits 462 and 467 are in the lower half 414 of the data 402a. The combination of the error bits 462 and 467 induces the on-die SEC codeword to falsely detect a third bit 466 as an error bit, where the bit 466 is in fact a correct bit falsely identified as an error bit and which will be mis-corrected by the on-die SEC, thus making a third bit 466 in error. The bit 466 is in the upper half 412 of the data 402a.

In a third scenario (referred to as "Scenario C"), the bit 462 and a bit 468 are error bits actually occurring in the burst 400. As shown, the error bit 462 occurs in the lower half 414 of the data 402a. The error bit 468 occurs in the lower half 414 of the data 404a, which is a codeword different from the on-die SEC codeword 402. In Scenario C, a third error bit is not induced by the on-die SEC based on the error bits 462 and 468.

The SECDED codeword 401 corresponds to a (256, 247) SECDED scheme. As shown, the SECDED codeword 401 may be applied to the entire burst 400 to detect error bits therein, according to the (256, 247) SECDED scheme. That is, the SECDED codeword 401 may be used to detect error bits in all of the on-die SEC codewords 402 and 404. As described, the ECC scheme applied to the burst 400 is capable of detecting two error bits in the burst 400. In that regard, the SECDED codeword 401 can be applied to the burst 400 to detect the error bits 462 and 464 in Scenario A, and the error bits 462 and 468 in Scenario C.

With regard to Scenario B, two error bits 462 and 467 in the on-die SEC codeword 402 may be falsely corrected to generate the "error" bit 466, thus generating three total error bits. The SECDED codeword 401 therefore covers three error bits 462, 466, and 467 in Scenario B, meaning that the (256, 247) SECDED scheme using the SECDED codeword 401 may not detect the three error bits 462, 466, and 467. Accordingly, the SECDED codeword 401 of the (256, 247) SECDED scheme may not be capable of addressing Scenario B. In some cases, the (256, 247) SECDED scheme may not be implemented with DDR5 DRAMs with a 16-bit channel, which is typically used in low-performance and low-cost products where individual DRAM devices are used rather than DIMM modules which may have a 40 bit channel 150 including a 32 bit data interface 120 and 8 bit parallel ECC parity 130.

In some implementations, a (128, 120) SECDED scheme can be used on the burst 400 to detect error bits therein. In the (128, 120) SECDED scheme, 120 bits of user data are encoded into a 128 bit codeword and saved in the DRAM in burst 100 including the data 102a, 104a, 106a and 108a on the lanes 121, 122, 123 and 124, respectively.

In some examples, the on-die SEC in DDR5 DRAM designs can detect and correct all 1-bit errors. In such examples, a SoC ECC scheme can provided by an ECC component (e.g., in a memory controller separate from and communicably coupled to the die on which the on-die SEC is provided) to detect and correct other errors (e.g., 2-bit errors and 3-bit errors). In that regard, a BCH decoder can be configured to only correct 1-bit errors and reject (e.g., not correct) two-bit errors. This means that the BCH decoder is guaranteed to reject all three-bit errors, given that the three-bit errors are induced in some cases in which 2-bit errors occur.

In some examples, a (512, 493) BCH ECC scheme can be implemented on all configurations of DDR5 DRAMs such as but not limited to, 32-bit data interfaces (e.g., the data interface 120), 16-bit data interfaces (e.g., the data interface 420), and so on. In the (512, 493) SECDED scheme, 493 bits of user data are encoded into a 512 bit codeword and saved in the DRAM in burst 100 including the data 102a, 104a, 106a and 108a on the lanes 121, 122, 123 and 124, respectively. The (512, 493) BCH ECC scheme can guarantee the detection any 2-bit error in a DRAM burst, which can result in a 3-bit error as described.

In some examples, the BCH decoder implemented for DDR4 DRAMs is configured to correct 1-bit errors and 2-bit errors, given that DDR4 DRAMs does not implement on-die SEC, and the probability of a single codeword containing 3 randomly generated errors is extremely small.

In some examples, a memory controller (e.g., of a SSD) can use a SECDED ECC codeword to detect and correct errors in data bits stored in a DDR5 DRAM (with on-die SEC) that has a 32-bit channel or a 16-bit channel. In some examples, a memory controller (e.g., of a SSD) can use a SECDED ECC codeword to detect and correct errors in data bits stored in a DDR4 DRAM (without on-die SEC). The SECDED ECC codeword may use a considerable number of parity bits. On the other hand, a (512, 493) BCH codeword has a code rate higher than that of a SECDED ECC codeword, supports DDR5 DRAM (with on-die SEC) that has a 32-bit channel or a 16-bit channel as well as DDR4 DRAM (without on-die SEC), and uses a number of parity bits smaller than that used by a SECDED ECC codeword.

In some examples in which a SECDED ECC scheme is used in a memory controller communicable coupled to a DDR5 DRAM die, the SECDED codeword does not span past a center point of any on-die SEC codeword to ensure that the SECDED codeword does not encounter three errors (two actual error bits and a third error bit introduced by a mis-correction by the on-die SEC), as described with reference to FIG. 3, for example.

In some examples in which a BCH ECC scheme is used in a memory controller communicable coupled to a DDR5 DRAM die, the BCH codeword can detect all permutations of two-bit errors and three-bit errors (e.g., Scenarios A-C described with reference to FIGS. 1-4) without the need to consider how the BCH codeword aligns with the on-die SEC codewords. In that regard, the BCH codeword can be sized to suit application of the memory controller.

Figure 5:
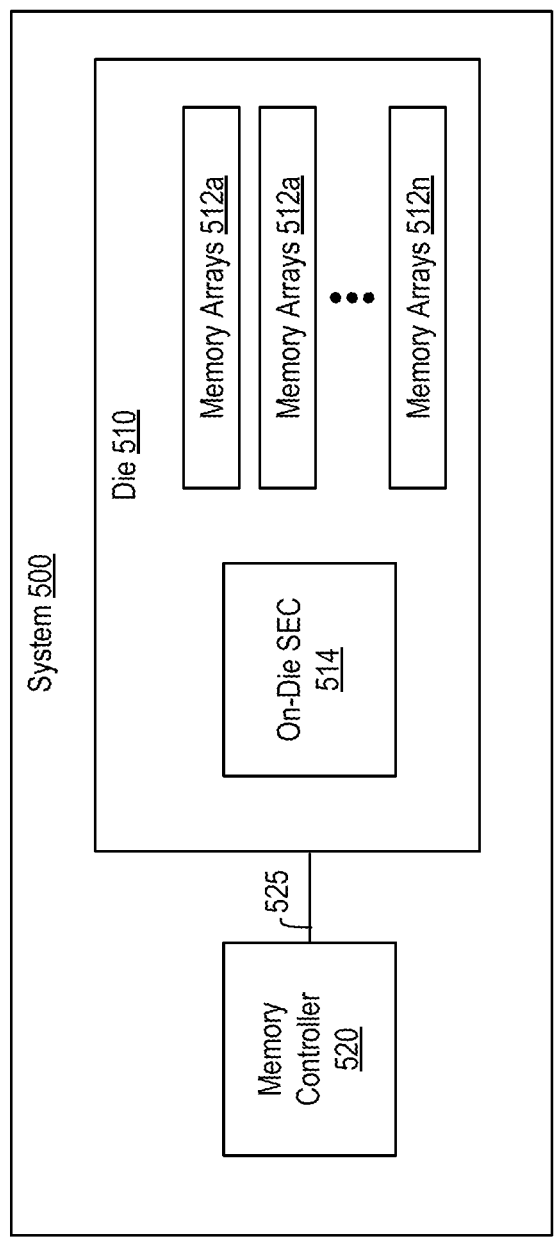
FIG. 5 is a block diagram illustrating an example SoC, according to some arrangements.

FIG. 5 is a block diagram illustrating an example system 500, according to some arrangements. Referring to FIGS. 1-5, the system 500 a die 510 and a memory controller 520. As shown, the die 510 (e.g., a DRAM die) corresponds to circuitry that implements a DDR5 DRAM design and includes one or more memory arrays (e.g., memory arrays 512a-512n) and an on-die SEC 514. The die 510 can be referred to as a DRAM die. The memory arrays 512a-512n can be an array of dynamic memory cells, and can be arranged in parallel to provide storage capabilities.

The on-die SEC 514 provides on-die error correction referred to a first error correction function (e.g., a first ECC scheme) for data bits stored in the memory arrays 512a-512n. In other words, given that the on-die SEC 514 and the memory arrays 512a-512n are provided on the same die 510, the on-die SEC 514 can provide on-die error correction capabilities for the memory arrays 512a-512n. In some examples, the on-die SEC 514 can generate the on-die parity 140 and 440.

As described, while the on-die SEC 514 can detect (and, in some examples, correct) 1 error bit in 128 bits of data (e.g., one error per SEC codeword), due to the limitations of the one-die SEC 514, the on-die SEC 514 may fail to detect 2 error bits in 128 bits of data (e.g., two errors per SEC codeword). In some cases, the on-die SEC 514 may even introduce 1 error bit in addition to the 2 error bits in 128 bits of data, resulting in three total errors per SEC codeword. This may be case when the die 510 is implemented in the system 500 that is an SSD, where the die 510 (e.g., the memory arrays 512*a*-512*n*) serves as the volatile memory storage for the SSD, and the memory controller 520 is part of an SoC (not shown for clarity) which is a non-volatile memory controller.

In that regard, the memory controller 520 can provide additional, second error correction function (e.g., a second ECC scheme). As described, the second error correction function can be a SECDED ECC scheme or a BCH ECC scheme.

The memory controller 520 is communicatively coupled to the die 510 via a memory data bus 525. The second error correction function can be used to correct the error(s) introduced by the on-die error correction performed by the on-die SEC 514 and/or the memory data bus 525. Data intended to be stored on the die 510 is first encoded using a SECDED ECC scheme or a BCH ECC scheme before sending to the die 510 in data bursts. The SECDED ECC scheme or BCH ECC scheme is specifically designed to correct errors not detected or corrected by the on-die SEC 514, introduced by the on-die correction performed by the on-die SEC 514 and/or the memory bus 525.

The memory controller 520 and the on-die SEC 514 can be implemented by separate processing circuits, each having suitable processing and memory storage capabilities. For instance, the memory controller 520 can be implemented by a first processing circuit (having a first processor and a first memory device), and the on-die SEC 514 can be implemented by a second processing circuit (having a second processor and a second memory device).

While FIG. 5 shows one die (e.g., the die 510), the system 500 can include two or more dies (each of which can be a die such as but not limited to, the die 510) communicably coupled to the memory controller 520, which can provide the second error correction function (e.g., the second ECC scheme) for all dies operatively coupled thereto.

Figure 6:
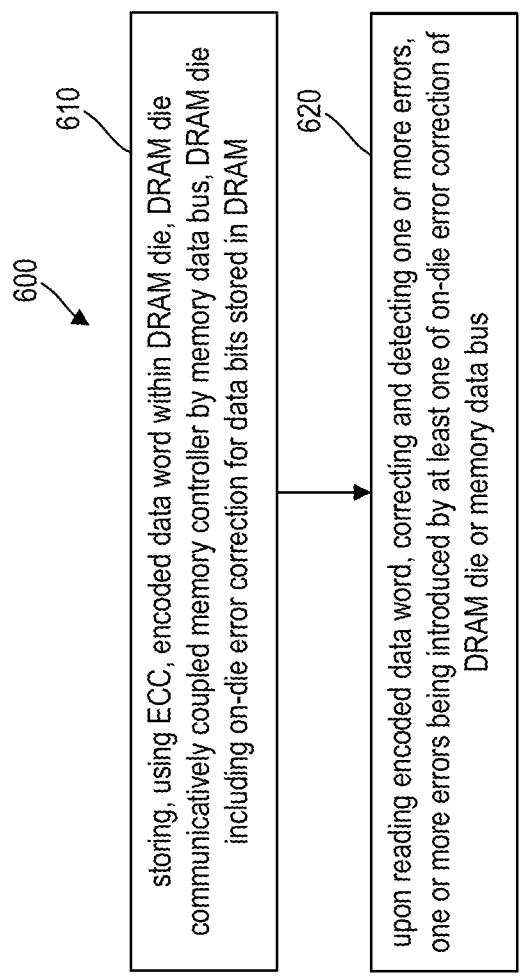
FIG. 6 is a flow diagram illustrating an example method for correcting errors in DRAM, according to some arrangements.

FIG. 6 is a flow diagram illustrating an example method 600 for correcting errors in DRAM, according to some arrangements. Referring to FIGS. 1-6, the method 600 can be performed by the memory controller 520.

At 610, the memory controller 520 stores, using an ECC, an encoded data word (e.g., a codeword) within a DRAM die (e.g., the DRAMs 512*a*-512*n* of the die 510). The die 510 is communicatively coupled the memory controller 520 by the memory data bus 525. The die 510 includes on-die error correction (e.g., performed by the on-die SEC 514) for data bits stored in the die 510. In some examples, the data bits correspond to the burst 100 or the burst 200.

At 620, upon reading the encoded data word, the memory controller 520 corrects and detects one or more errors. The one or more errors are not detected or introduced by at least one of the on-die error correction of the die 510 or the memory data bus 525.

In some arrangements, the ECC is a BCH ECC. The BCH ECC can be a (512, 493) BCH ECC. The encoded data word includes one or more (512, 493) BCH codewords. In some arrangements, the memory controller 520 includes a BCH decoder. The BCH decoder corrects any 1 bit in error in each DRAM burst and reject any 2 bits in error in each DRAM burst which might result in 3 bits in error. In some arrangements, the BCH decoder may be configured to correct both any single bit in error and any two bits in error, for example when the die 510 does not have on-die SEC 514 or the on-die SEC 514 is disabled.

The encoded data word includes one or more SECDED codewords. In some examples, the data bits corresponds to one or more on-die SEC codewords generated by the on-die error correction. The data bits corresponds to the one or more SECDED codewords. Each of the one or more SECDED codewords does not span past a center of any of the one or more on-die SEC codewords. In one example, a first one of the one or more SECDED codewords (e.g., the SECDED codeword 300) covers a first half (e.g., the upper half 112) of each of the one-die SEC codewords 102, 104, 106, and 108, and a second one of the one or more SECDED codewords (e.g., the SECDED codeword 300) covers a second half (e.g., the lower half 114) of each of the one-die SEC codewords 102*a,b*, 104*a,b*, 106*a,b*, and 108*a,b*. Each of the one-die SEC codewords 102*a,b*, 104*a,b*, 106*a,b*, and 108*a,b* is divided into the first half (e.g., the upper half 112) and the second half (e.g., the lower half 114) along the center.

In some examples, the SECDED ECC is a (256, 247) SECDED ECC, and the one or more SECDED codewords are one or more (256, 247) SECDED codewords 300 and 310. In such examples, the die 510 includes the 32-bit data interface 120.

In some examples, the SECDED ECC is a (128, 120) SECDED ECC, and the one or more SECDED codewords are one or more (128, 120) SECDED codewords. In such examples, the die 510 includes the 16-bit data interface 420.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storages, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A system for correcting errors in Dynamic Random Access Memory (DRAM), comprising:
   a memory controller; and
   a DRAM die, the DRAM die communicatively coupled the memory controller by a memory data bus, the DRAM die comprising Single Error Correction (SEC) on-die error correction for data bits stored in the DRAM die,
   wherein the memory controller is configured to:
      store, using a Single Error Correction, Double Error Detection (SECDED) Error Correcting Code (ECC), an encoded data word within the DRAM die, wherein the encoded data word stored within the DRAM die comprises one or more SECDED codewords; and
      upon reading the encoded data word after the SEC on-die error correction of the DRAM die has been performed on the encoded data word and the encoded data word has been communicated from the DRAM die to the memory controller via the memory data bus, correct and detect one or more errors, wherein the memory controller includes an ECC decoder that is configured to correct an 1-bit error in each DRAM burst and that is further configured to detect 2-bit errors and 3-bit errors, but not attempt correction of detected 2-bit errors in each DRAM burst.

2. The system of claim 1, wherein the ECC is a Bose-Chaudhuri-Hocquenghem (BCH) ECC.

3. The system of claim 2, wherein
   the BCH ECC is a (512, 493) BCH ECC; and
   the encoded data word comprises one or more (512, 493) BCH codewords.

4. The system of claim 1, wherein
   the ECC decoder comprises a Bose-Chaudhuri-Hocquenghem (BCH) decoder; and
   the BCH decoder corrects an 1-bit error in each DRAM burst and is configured in a mode to detect, but not attempt correction of detected 2-bit errors in each DRAM burst.

5. The system of claim 1, wherein
each of the one or more SECDED codewords does not span past a center of any of the one or more on-die SEC codewords.

6. The system of claim 5, wherein
a first one of the one or more SECDED codewords covers a first half of at least one of the one or more on-die SEC codewords;
a second one of the one or more SECDED codewords covers a second half of the at least one of the one or more on-die SEC codewords; and
each of the at least one of the one or more on-die SEC codewords is divided into the first half and the second half along the center.

7. The system of claim 1, wherein
the SECDED ECC is a (256, 247) SECDED ECC; and
the one or more SECDED codewords are one or more (256, 247) SECDED codewords.

8. The system of claim 7, wherein the DRAM die comprises a 32-bit data interface.

9. The system of claim 1, wherein
the SECDED ECC is a (128, 120) SECDED ECC; and
the one or more SECDED codewords are one or more (128, 120) SECDED codewords.

10. The system of claim 9, wherein the DRAM die comprises a 16-bit data interface.

11. A method for correcting errors in Dynamic Random Access Memory (DRAM), comprising:
storing, by a memory controller using a Single Error Correction, Double Error Detection (SECDED) Error Correcting Code (ECC), an encoded data word within a DRAM die, wherein the encoded data word stored within the DRAM die comprises one or more SECDED codewords the DRAM die communicatively coupled the memory controller by a memory data bus, the DRAM die comprising Single Error Correction (SEC) on-die error correction for data bits stored in the DRAM die; and
upon reading the encoded data word after the SEC on-die error correction of the DRAM die has been performed on the encoded data word and the encoded data word has been communicated from the DRAM die to the memory controller via the memory data bus, correcting and detecting, by the memory controller, one or more errors, wherein the memory controller includes an ECC decoder that is configured to correct an 1-bit error in each DRAM burst and that is further configured to detect 2-bit errors and 3-bit errors, but not attempt correction of detected 2-bit errors in each DRAM burst.

12. The method of claim 11, wherein the ECC is a Bose-Chaudhuri-Hocquenghem (BCH) ECC.

13. The method of claim 12, wherein
the BCH ECC is a (512, 493) BCH ECC; and
the encoded data word comprises one or more (512, 493) BCH codewords.

14. The method of claim 11, wherein
the ECC decoder comprises a Bose-Chaudhuri-Hocquenghem (BCH) decoder; and
the BCH decoder corrects an 1-bit error in each DRAM burst and is configured in a mode to detect, but not attempt correction of detected 2-bit errors in each DRAM burst.

15. The method of claim 11, wherein
each of the one or more SECDED codewords does not span past a center of any of the one or more on-die SEC codewords.

16. The method of claim 15, wherein
a first one of the one or more SECDED codewords covers a first half of at least one of the one or more on-die SEC codewords;
a second one of the one or more SECDED codewords covers a second half of the at least one of the one or more on-die SEC codewords; and
each of the at least one of the one or more on-die SEC codewords is divided into the first half and the second half along the center.

17. The method of claim 16, wherein the SECDED ECC is:
a (256, 247) SECDED ECC for the DRAM die that has a 32-bit data interface; or
a (128, 120) SECDED ECC for the DRAM die that has a 16-bit data interface.

18. A non-transitory computer-readable medium storing computer-readable instructions, such that when executed, causes a memory controller of to:
store, using a Single Error Correction, Double Error Detection (SECDED) Error Correcting Code (ECC), an encoded data word within a Dynamic Random Access Memory (DRAM) die, wherein the encoded data word stored within the DRAM die comprises one or more SECDED codewords, the DRAM die communicatively coupled the memory controller by a memory data bus, the DRAM die comprising on-die Single Error Correction (SEC) error correction for data bits stored in the DRAM; and
upon reading the encoded data word after the SEC on-die error correction of the DRAM die has been performed on the encoded data word and the encoded data word has been communicated from the DRAM die to the memory controller via the memory data bus, correct and detect one or more errors, wherein the memory controller includes an ECC decoder that is configured to correct an 1-bit error in each DRAM burst and that is further configured to detect 2-bit errors and 3-bit errors, but not attempt correction of detected 2-bit errors in each DRAM burst.

* * * * *